(12) United States Patent
Chiang et al.

(10) Patent No.: US 8,558,349 B2
(45) Date of Patent: Oct. 15, 2013

(54) INTEGRATED CIRCUIT FOR A HIGH-SIDE TRANSISTOR DRIVER

(75) Inventors: Chiu-Chih Chiang, Hsinchu (TW);
Chih-Feng Huang, Hsinchu County (TW); Ta-yung Yang, Milpitas, CA (US)

(73) Assignee: System General Corp., New Taipei (TW)

( * ) Notice: Subject to any disclaimer, the term of this patent is extended or adjusted under 35 U.S.C. 154(b) by 603 days.

(21) Appl. No.: 11/464,075

(22) Filed: Aug. 11, 2006

(65) Prior Publication Data
US 2008/0036027 A1    Feb. 14, 2008

(51) Int. Cl.
*H01L 21/70*     (2006.01)

(52) U.S. Cl.
USPC .... 257/545; 257/500; 257/504; 257/E29.342; 257/300; 257/314

(58) Field of Classification Search
USPC .......................................... 257/300, 314, 500
See application file for complete search history.

(56) References Cited

U.S. PATENT DOCUMENTS

| | | | | |
|---|---|---|---|---|
| 5,434,445 | A * | 7/1995 | Ravanelli et al. | 257/488 |
| 5,501,994 | A * | 3/1996 | Mei | 438/200 |
| 5,966,341 | A * | 10/1999 | Takahashi et al. | 365/230.03 |
| 6,236,100 | B1 * | 5/2001 | Pernyeszi | 257/500 |
| 6,323,539 | B1 * | 11/2001 | Fujihira et al. | 257/630 |
| 6,344,959 | B1 | 2/2002 | Milazzo | |
| 6,677,210 | B1 * | 1/2004 | Hebert | 438/301 |
| 6,781,422 | B1 | 8/2004 | Yang | |
| 6,836,173 | B1 | 12/2004 | Yang | |
| 6,864,539 | B2 * | 3/2005 | Ishibashi et al. | 257/368 |
| 6,887,750 | B2 * | 5/2005 | Hayashi | 438/199 |
| 7,388,266 | B2 * | 6/2008 | Wu | 257/409 |
| 2004/0262660 | A1 * | 12/2004 | Huang | 257/301 |
| 2005/0156200 | A1 * | 7/2005 | Kinoshita | 257/207 |

FOREIGN PATENT DOCUMENTS

| | | |
|---|---|---|
| JP | 05-129425 | 5/1993 |
| TW | I297207 | 5/2008 |

OTHER PUBLICATIONS

Chinese Examination Report of Taiwan Application No. 095128588, dated on Jul. 14, 2009.

* cited by examiner

*Primary Examiner* — S. V. Clark
*Assistant Examiner* — Jesse Y Miyoshi
(74) *Attorney, Agent, or Firm* — J.C. Patents

(57) ABSTRACT

The high voltage integrated circuit is disclosed. The high voltage integrated circuit comprises a low voltage control circuit, a floating circuit, a P substrate, a deep N well disposed in the substrate and a plurality of P wells disposed in the P substrate. The P wells and deep N well serve as the isolation structures. The low voltage control circuit is located outside the deep N well and the floating circuit is located inside the deep N well. The deep N well forms a high voltage junction barrier for isolating the control circuit from the floating circuit.

14 Claims, 5 Drawing Sheets

INTEGRATED CIRCUIT FOR A HIGH-SIDE TRANSISTOR DRIVER

BACKGROUND OF THE INVENTION

1. Field of the Invention

The present invention relates in general to an integrated circuit, and more particularly to an integrated circuit for a high-side transistor driver.

2. Description of the Prior Art

A variety of power supplies and motor drivers utilize the bridge circuits to control a power source to the load. The bridge circuit normally has a high side transistor connected to the power source and a low side transistor connected to the ground. A common node between the high side transistor and the low-side transistor is coupled to the load. As transistors are controlled to alternately conduct, the voltage of the common node swings in between the power source and the ground. Therefore the control of a high-side transistor driver requires a charge pump circuit and/or a floating drive circuit in order to fully turn on the high-side transistor. In recent development, many floating circuits are being disclosed in U.S. Pat. No. 6,344,959 (Milazzo), U.S. Pat. No. 6,781,422 (Yang) and U.S. Pat. No. 6,836,173 (Yang).

FIG. 1 shows a high-side transistor drive circuit. A floating circuit 10 is applied to control the on/off of the high-side transistor 20. A feeding capacitor 15 is connected to send the control signal S1 from a low-voltage inverter 16 to the floating circuit 10. A charge-pump capacitor 40 provides a supply voltage to the floating circuit 10. A voltage $V_D$ charges the charge-pump capacitor 40 through a diode 45 once the low-side transistor 30 is switched on. The ground reference of the charge-pump capacitor 40 is pulled to the level of the voltage source VIN when the high-side transistor 20 is turned on.

SUMMARY OF THE INVENTION

Accordingly, an objective of the present invention is to provide a monolithic IC process to integrate low-voltage control circuits with a high-voltage floating drive circuit. Furthermore, the integration is achieved by using a typical IC process, so as to accomplish the low cost and high production yield.

A high voltage integrated circuit comprises a P substrate. An N diffusion region containing N conductivity type forms a deep N well disposed in the P substrate. Separated P diffusion regions containing the P conductivity type form P wells disposed in the P substrate and the deep N well for the isolation. The low voltage control circuit is located outside the deep N well. A floating circuit is located inside the deep N well. A high voltage junction barrier is thus formed isolating the control circuit from the floating circuit. Furthermore, a capacitor is disposed above the portion of the deep N well for feeding the control signal from the low-voltage control circuit to the floating circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE PREFERRED EMBODIMENTS

Figure 1:
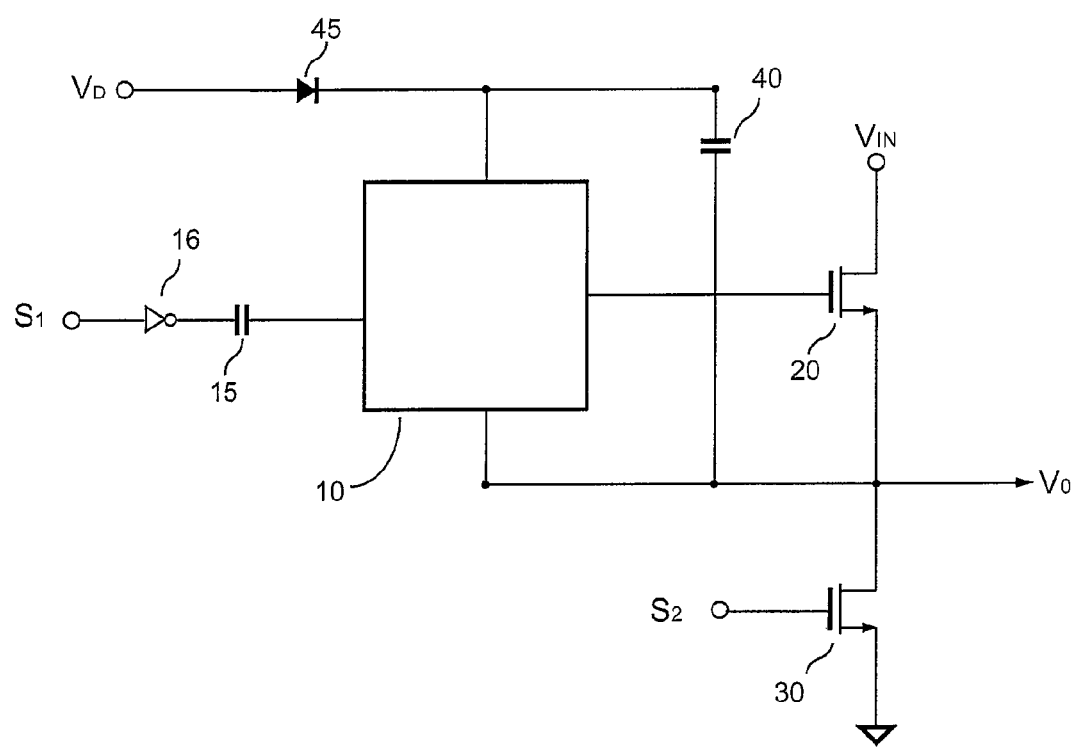
FIG. 1 shows a high-side transistor drive circuit.
Figure 2:
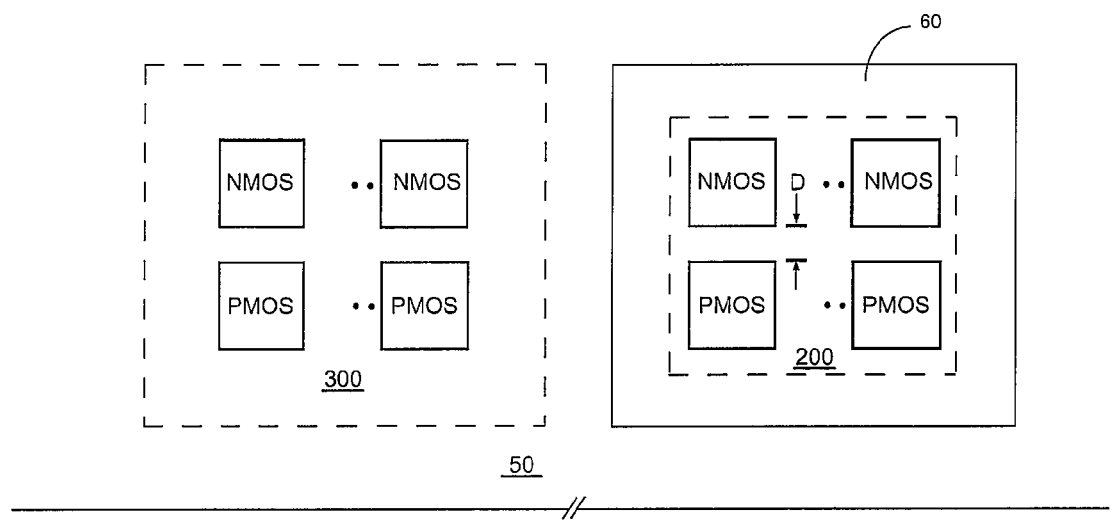
FIG. 2 is a top view of an integrated circuit for high-side transistor driver according to an embodiment of the present invention.

FIG. 2 is a top view of an integrated circuit for a high-side driver according to an embodiment of the present invention. The integrated circuit includes a P substrate 50, an N diffusion region containing N conductivity type such as an n+ diffusion region. The N conductivity type is the donor-doped type such as using phosphorus ions or arsenic ions to be the donors. The N diffusion region forms a deep N well 60 disposed in the P substrate 50. A low voltage control circuit 300 is located outside the deep N well 60. A floating circuit 200 is located inside the deep N well 60.

Figure 3:
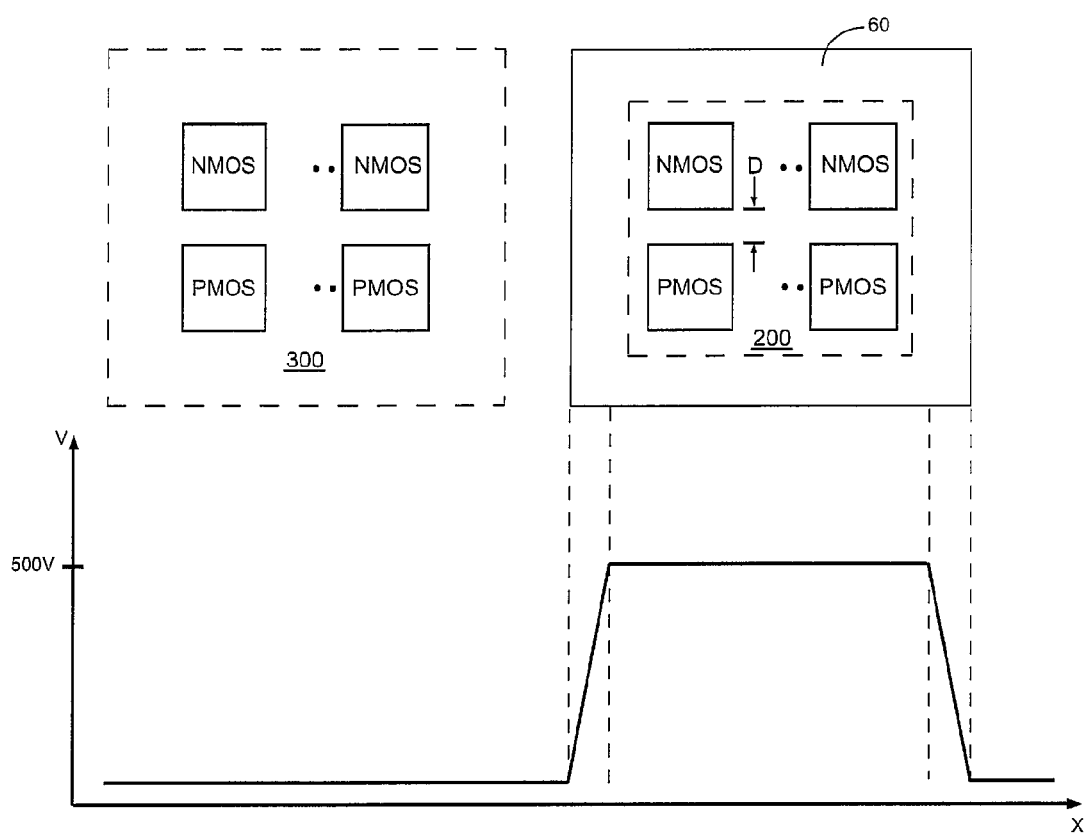
FIG. 3 shows a voltage distribution when 500V is applied to the floating circuit according to an embodiment of the present invention.

FIG. 3 shows a voltage distribution when 500V is applied to the floating circuit 200. High voltage junction barriers 101a and 101b (FIG. 5) are formed for isolating the control circuit 300 and the floating circuit 200 when a voltage of 500V is applied to the floating circuit 200.

Figure 4:
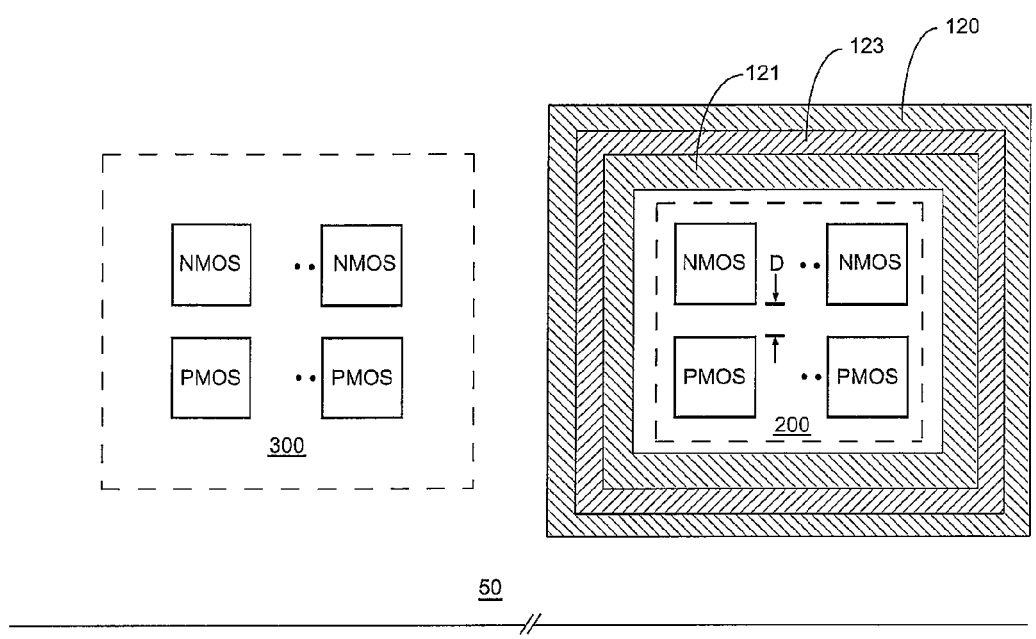
FIG. 4 is a top view of the integrated circuit including a capacitor for feeding the control signal from the control circuit to the floating circuit according to an embodiment of the present invention.

FIG. 4 is a top view of the integrated circuit including a capacitor for feeding the control signal of the control circuit 300 to the floating circuit 200 according to an embodiment of the present invention. The capacitor includes a first metal layer 125 and second metal layers 120 and 121 disposed above a portion of the deep N well 60 and the first metal layer 125 to form a capacitor. In addition, a dielectric layer 123 disposed between the first metal layer 125 and the second metal layer 120 and between the first metal layer 125 and the second metal layer 121.

Figure 5:
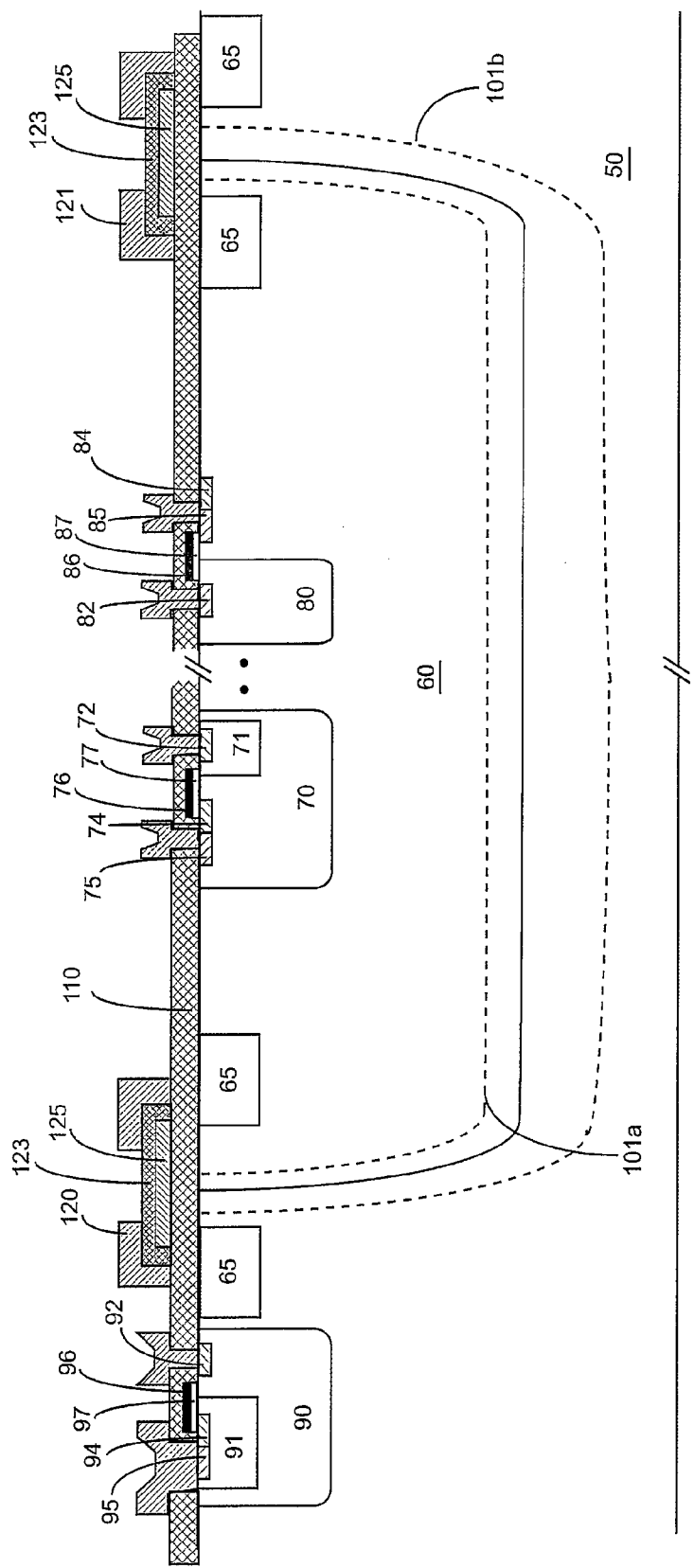
FIG. 5 is a cross-section view of the integrated circuit according to an embodiment of the present invention.

FIG. 5 is a cross-sectional view of a proposed integration circuit, in which P diffusion regions containing the P conductivity type forms P regions 65 such as P-body disposed in the P substrate 50 and the deep N well 60 for isolation purpose. The P conductivity type is the acceptor-doped type such as using boron ions to be the acceptor. P regions 65 help to form depletion regions for serving as isolation structures. The control circuit 300 and the floating circuit 200 include N type Metal-Oxide-Semiconductor Field-Effect-Transistors (MOSFET) devices and P type MOSFET devices. The N type MOSFET device in the floating circuit 200 comprises a first P diffusion region containing P conductivity type, which forms a P well 70 disposed in the deep N well 60. A first N diffusion region containing the N conductivity type forms an N region 71 and is located in the P well 70. A first drain diffusion region having the N+ conductivity type, which forms a drain region 72 is disposed in the N region 71 (N-type Double Diffusion region). A first source diffusion region having the N+ conductivity type forms a source region 74. A conduction channel is developed between the source region 74 and the drain region 72. A polysilicon gate electrode 76 is disposed above oxides 77 to control the current flow in the conduction channel. A first contact diffusion region containing P+ conductivity type forms a contact region 75. The high voltage junction barriers 101a and 101b are formed for isolating the control circuit 300 and the floating circuit 200 when a voltage of 500V is applied to the floating circuit 200.

The P type MOSFET device in the floating circuit 200 comprises a second P diffusion region containing P conductivity type, which forms a P well 80 disposed in the deep N well 60. A second drain diffusion region having the P+ conductivity type forms a drain region 82 and is disposed in the P well 80. A second source diffusion region having the P+ conductivity type forms a source region 85. A conduction channel is formed between the source region 85 and the drain region 82. A polysilicon gate electrode 86 is disposed above oxides to control the current flow in the conduction channel. A second contact diffusion region containing N+ conductivity type forms a contact region 84.

The N type MOSFET device in the control circuit 300 comprises a third N diffusion region containing N conductivity type, which forms an N well 90 is disposed in the P substrate 50. A third P diffusion region containing the P conductivity type forms a P region 91 and is located in the N well 90. A third drain diffusion region having the N+ conductivity type, which forms a drain region 92 is disposed in the N well 90. A third source diffusion region having the N+ conductivity type forms a source region 94. A conduction channel is formed between the source region 94 and the drain region 92. A polysilicon gate electrode 96 is disposed above oxides to control the current flow in the conduction channel. A third contact diffusion region containing P+ conductivity type forms a contact region 95. The third P diffusion region encloses the source region 94 and the contact region 95. A silicon dioxide insulation layer 110 covers the polysilicon gates and the field oxides. The first metal layer 125 is disposed above the silicon dioxide insulation layer 110. The second metal layers 120 and 121 are disposed above the portion of the deep N well 60, which are interleaved with the first metal layer 125 to form the capacitor.

It will be apparent to those skilled in the art that various modifications and variations can be made to the structure of the present invention without departing from the scope or spirit of the invention. In view of the foregoing it is intended that the present invention cover modifications and variations of this invention provided they fall within the scope of the following claims or their equivalents.

What is claimed is:

1. A high voltage integrated circuit comprising:
   a P substrate;
   a deep N well, disposed in the P substrate, wherein a wall of the deep N well forms a high voltage junction barrier, wherein the deep N well extends from an upper-most surface of the P substrate;
   a control circuit, located an outside of the deep N well;
   a MOS circuit, located an inside of the deep N well, wherein the MOS circuit is within the deep N well with separation from other circuit;
   an insulating layer over the deep N well, extending from the inside of the deep N well to the outside of the deep N well;
   a first metal layer, disposed on the insulating layer over the high voltage junction barrier of the deep N well;
   a dielectric layer on the first metal layer with an end portion contacting on the insulating layer to fully insulate the first metal layer; and
   a second metal layer, disposed above and on the dielectric layer with an end portion on the insulating layer, so that the first metal layer and the dielectric layer are enclosed within the second metal layer;
   wherein the first metal layer, the second metal layer and the dielectric layer form a capacitor located above a periphery region of the deep N well without direct connection to the deep N well for feeding a control signal of the control circuit to the floating circuit, and wherein the deep N well forms the high voltage junction barrier isolating the control circuit from the floating circuit, wherein the floating circuit is within the deep N well without direct connection to the capacitor.

2. The high voltage integrated circuit of claim 1, further comprising a plurality of first P diffusion regions disposed in the P substrate, and wherein the first P diffusion regions and the deep N well serve as isolation structures.

3. The high voltage integrated circuit of claim 1, wherein the floating circuit includes at least one N type MOSFET device comprising:
   a first P well, disposed in the deep N well;
   a first N diffusion region, located in the first P well;
   a first drain region, disposed in the first N diffusion region;
   a first source region, disposed in the first P well wherein a conduction channel is formed between the first source region and the first drain region; and
   a first contact region, disposed in the first P well.

4. The high voltage integrated circuit of claim 1, wherein the floating circuit includes at least a MOSFET device comprising:
   a P well, disposed in the deep N well;
   a drain region, disposed in the P well;
   a source region, disposed in the deep N well, wherein a conduction channel is formed between the source region and the drain region; and
   a contact region, disposed in the deep N well.

5. The high voltage integrated circuit of claim 1, wherein the control circuit includes at least a MOSFET device comprising:
   a first N well, disposed in the P substrate;
   a P diffusion region, located in the first N well;
   a drain region, disposed in the first N well;
   a source region, disposed in the P diffusion region, wherein a conduction channel is formed between the source region and the drain region; and
   a contact region, disposed in the P diffusion region, wherein the P diffusion region encloses the source region and the contact region.

6. An integrated circuit comprising:
   a P substrate;
   a deep N well, disposed in the P substrate, wherein a wall of the deep N well forms a high voltage junction barrier, wherein the deep N well extends from an upper-most surface of the P substrate;
   a control circuit, located an outside of the deep N well;
   an insulating layer on the deep N well, extending from the inside of the deep N well to the outside of the deep N well;
   a capacitor disposed on the insulating layer at a periphery of the deep N well without directly connecting to the deep N well, wherein the capacitor comprises:
   a first metal layer, disposed on the insulating layer over the high voltage junction barrier of the deep N well;
   a dielectric layer on the first metal layer with an end portion contacting on the insulating layer to fully insulate the first metal layer; and
   a second metal layer, disposed above and on the dielectric layer with an end portion on the insulating layer, so that the first metal layer and the dielectric layer are enclosed within the second metal layer; and the MOS circuit, located at an inside of the deep N well, wherein the MOS circuit is within the deep N well with separation from other circuit, wherein the high voltage junction barrier of the deep N well is at a high voltage level isolating the control circuit from the MOS circuit.

7. The integrated circuit of claim 6, further comprising a plurality of first P diffusion regions disposed in the P substrate, wherein the first P diffusion regions and the deep N well serve as isolation structures.

8. The integrated circuit of claim 6, wherein the capacitor comprises:
the first metal layer and the second metal layer form a capacitor for feeding the control signal of the control circuit to the floating MOS circuit.

9. The integrated circuit of claim 6, wherein the MOS circuit includes at least one N type MOSFET device comprising:
a first P well, disposed in the deep N well;
a first N diffusion region, located in the first P well;
a first drain region, disposed in the first N diffusion region;
a first source region, wherein a conduction channel is formed between the first source region and the first drain region; and
a first contact region, disposed in the first P well.

10. The integrated circuit of claim 6, wherein the MOS circuit includes at least a MOSFET device comprising:
a P well, disposed in the deep N well;
a drain region, disposed in the P well;
a source region, wherein a conduction channel is formed between the source region and the drain region; and
a contact region, disposed in the deep N well.

11. The integrated circuit of claim 6, wherein the control circuit includes at least a MOSFET device comprising:
a first N well, disposed in the P substrate;
a P diffusion region, located in the first N well;
a drain region, disposed in the first N well;
a source region, disposed in the P diffusion region, wherein a conduction channel is formed between the source region and the drain region; and
a contact region, disposed in the P diffusion region, wherein the P diffusion region encloses the source region and the contact region.

12. The high voltage integrated circuit of claim 1, further comprising a third metal layer, disposed over the dielectric layer and the insulating layer at the outside of the deep N well.

13. A high voltage integrated circuit comprising:
a P substrate;
a deep N well, disposed in the P substrate, wherein a wall of the deep N well forms a high voltage junction barrier;
a control circuit, located an outside of the deep N well;
a MOS circuit, located an inside of the deep N well, wherein the MOS circuit is within the deep N well with separation from other circuit;
an insulating layer on over the deep N well, extending from the inside of the deep N well to the outside of the deep N well;
a first metal layer, disposed on the insulating layer over the high voltage junction barrier of the deep N well;
a dielectric layer on the first metal layer with an end portion contacting on the insulating layer to fully insulate the first metal layer; and
a second metal layer, disposed above and on the dielectric layer with an end portion on the insulating layer, so that the first metal layer and the dielectric layer are enclosed within the second metal layer;
wherein the first metal layer, the second metal layer and the dielectric layer form a capacitor located above an entire periphery region of the deep N well without direct connection to the deep N well for feeding a control signal of the control circuit to the MOS circuit, and wherein the deep N well forms the high voltage junction barrier isolating the control circuit from the MOS circuit, wherein the MOS circuit is within the deep N well without direct connection to the capacitor.

14. An integrated circuit comprising:
a P substrate;
a deep N well, disposed in the P substrate, wherein a wall of the deep N well forms a high voltage junction barrier;
a control circuit, located an outside of the deep N well;
an insulating layer on the deep N well, extending from the inside of the deep N well to the outside of the deep N well;
a capacitor disposed on the insulating layer at an entire periphery and an inside of the deep N well without directly connecting to the deep N well for feeding a control signal of the control circuit to a MOS circuit, wherein the capacitor comprises:
a first metal layer, disposed on the insulating layer over the high voltage junction barrier of the deep N well;
a dielectric layer on the first metal layer with an end portion contacting on the insulating layer to fully insulate the first metal layer; and
a second metal layer, disposed above and on the dielectric layer with an end portion on the insulating layer, so that the first metal layer and the dielectric layer are enclosed within the second metal layer; and
the MOS circuit, located at an inside of the deep N well, wherein, wherein the MOS circuit is isolated by the deep N well without physical interconnection structure to interconnect to other circuit, the high voltage junction barrier of the deep N well is at a high voltage level isolating the control circuit from the MOS circuit.

* * * * *